United States Patent
Obradovic et al.

(10) Patent No.: US 9,812,449 B2
(45) Date of Patent: Nov. 7, 2017

(54) MULTI-VT GATE STACK FOR III-V NANOSHEET DEVICES WITH REDUCED PARASITIC CAPACITANCE

(71) Applicant: Samsung Electronics Co., Ltd., Suwon-si, Gyeonggi-do (KR)

(72) Inventors: Borna J. Obradovic, Leander, TX (US); Titash Rakshit, Austin, TX (US); Mark S. Rodder, Dallas, TX (US); Wei-E Wang, Austin, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/158,459

(22) Filed: May 18, 2016

(65) Prior Publication Data

US 2017/0148787 A1    May 25, 2017

Related U.S. Application Data

(60) Provisional application No. 62/258,400, filed on Nov. 20, 2015.

(51) Int. Cl.
  *H01L 21/02* (2006.01)
  *H01L 27/088* (2006.01)
  (Continued)

(52) U.S. Cl.
  CPC ........ *H01L 27/088* (2013.01); *H01L 29/0665* (2013.01); *H01L 29/20* (2013.01); *H01L 29/4232* (2013.01); *H01L 29/4916* (2013.01)

(58) Field of Classification Search
  CPC ........... H01L 29/66545; H01L 29/7788; H01L 29/7786; H01L 29/205; H01L 29/78681
  See application file for complete search history.

(56) References Cited

U.S. PATENT DOCUMENTS

| | | |
|---|---|---|
| 5,559,049 A | 9/1996 | Cho |
| 6,063,677 A | 5/2000 | Rodder et al. |
| | (Continued) | |

FOREIGN PATENT DOCUMENTS

| | | |
|---|---|---|
| CN | 102903757 A | 1/2013 |
| WO | WO 2005/015653 A1 | 2/2005 |

OTHER PUBLICATIONS

Machine Translation of CN102903757 A, published Jan. 30, 2013 as set forth above.
(Continued)

*Primary Examiner* — Trung Q Dang
(74) *Attorney, Agent, or Firm* — Lewis Roca Rothgerber Christie LLP

(57) ABSTRACT

A nanosheet field effect transistor design in which the threshold voltage is adjustable by adjusting the composition of the gate. The channel of the nanosheet field effect transistor may be composed of a III-V semiconductor material, and the gate, which may be separated from the channel by a high dielectric constant dielectric layer, may also be composed of a III-V semiconductor material. Adjusting the composition of the gate may result in a change in the affinity of the gate, in turn resulting in a change in the threshold voltage. In some embodiments the channel is composed, for example, of $In_xGa_{1-x}As$, with x between 0.23 and 0.53, and the gate is composed of $InAs_{1-y}N_y$ with y between 0.0 and 0.4, and the values of x and y may be adjusted to adjust the threshold voltage.

20 Claims, 7 Drawing Sheets

(51) Int. Cl.
*H01L 29/06* (2006.01)
*H01L 29/20* (2006.01)
*H01L 29/423* (2006.01)
*H01L 29/49* (2006.01)

(56) References Cited

U.S. PATENT DOCUMENTS

| | | |
|---|---|---|
| 6,087,248 A | 7/2000 | Rodder |
| 6,093,610 A | 7/2000 | Rodder |
| 6,187,641 B1 | 2/2001 | Rodder et al. |
| 6,451,676 B2 | 9/2002 | Wurzer et al. |
| 6,787,861 B2 | 9/2004 | Lucovsky et al. |
| 6,794,232 B2 | 9/2004 | Zheng et al. |
| 7,030,464 B2 | 4/2006 | Masuoka et al. |
| 7,612,421 B2 | 11/2009 | Enicks |
| 7,682,845 B2 | 3/2010 | Pal et al. |
| 2006/0197120 A1 | 9/2006 | Surdeanu et al. |
| 2008/0280391 A1 | 11/2008 | Shin et al. |
| 2013/0161698 A1* | 6/2013 | Marino ............. H01L 29/42316 257/194 |
| 2014/0061722 A1* | 3/2014 | Doornbos ............. H01L 21/182 257/192 |
| 2014/0346564 A1* | 11/2014 | Doornbos ....... H01L 21/823412 257/190 |
| 2015/0295084 A1 | 10/2015 | Obradovic et al. |

OTHER PUBLICATIONS

Pfiester, et al., "A Self-Aligned Elevated Source/Drain MOSFET," IEEE Electron Device Letters, vol. 11, No. 9, Sep. 1990, pp. 365-367.

* cited by examiner

MULTI-VT GATE STACK FOR III-V NANOSHEET DEVICES WITH REDUCED PARASITIC CAPACITANCE

CROSS-REFERENCE TO RELATED APPLICATION(S)

The present application claims priority to and the benefit of U.S. Provisional Application No. 62/258,400, filed Nov. 20, 2015, entitled "A MULTI-VT GATESTACK FOR III-V NANOSHEET DEVICES WITH REDUCED PARASITIC CAPACITANCE", the entire content of which is incorporated herein by reference.

FIELD

One or more aspects of embodiments according to the present invention relate to field effect transistors and more particularly to a nanosheet field effect transistor with a work function gate composed of a noncrystalline semiconductor gate material.

BACKGROUND

Circuits including nanosheet field effect transistors with different threshold voltages may be fabricated using work-function metal gates with different thicknesses. This approach may, however, result in high parasitic capacitance due to the large vertical spacing between sheets required to accommodate the largest required thickness, and the fabrication of such devices may be challenging.

Thus, there is still a need for a nanosheet field effect transistor that may readily be fabricated with a range of threshold voltages.

SUMMARY

Aspects of embodiments of the present disclosure are directed toward a nanosheet field effect transistor design in which the threshold voltage is adjustable by adjusting the composition of the gate. The channel of the nanosheet field effect transistor may be composed of a III-V semiconductor material, and the gate, which may be separated from the channel by a high dielectric constant dielectric layer, may also be composed of a III-V semiconductor material. Adjusting the composition of the gate may result in a change in the affinity of the gate, in turn resulting in a change in the threshold voltage. In some embodiments the channel is composed, for example, of $In_xGa_{1-x}As$, with x between 0.23 and 0.53, and the gate is composed of $InAs_{1-y}N_y$, with y between 0.0 and 0.4, and the values of x and y may be adjusted to adjust the threshold voltage of the nanosheet field effect transistor. To fabricate a plurality of field effect transistors with different threshold voltages on one chip, the composition of the gate material may be varied across the chip.

According to an embodiment of the present invention there is provided a field effect transistor, including: a channel including, as a major component, a first III-V semiconductor material; a dielectric layer on the channel; and a semiconductor gate layer including, as a major component, a noncrystalline semiconductor.

In one embodiment, the semiconductor gate layer is less than 15 nm thick.

In one embodiment, the semiconductor gate layer includes, as a major component, $InAs_{1-x}N_x$, wherein x is between 0.0 and 1.0.

In one embodiment, x is between 0.0 and 0.4.

In one embodiment, x is between 0.1 and 0.3.

In one embodiment, the semiconductor gate layer includes, as a major component, $In_xP_{1-x}N$, wherein x is between 0.0 and 1.0.

In one embodiment, the semiconductor gate layer includes a dopant at a concentration exceeding $1\times10^{19}/cm^3$.

In one embodiment, the semiconductor gate layer includes the dopant at a concentration exceeding $5\times10^{19}/cm^3$.

In one embodiment, the semiconductor gate layer includes the dopant at a concentration exceeding $1\times10^{20}/cm^3$.

In one embodiment, the first III-V semiconductor material is $In_xGa_{1-x}As$, wherein x is between 0.0 and 1.0.

In one embodiment, x is between 0.23 and 0.53.

In one embodiment, the noncrystalline semiconductor is a polycrystalline semiconductor.

In one embodiment, the transistor includes a metal gate layer on the semiconductor gate layer.

In one embodiment, the first III-V semiconductor material includes a first chemical element and a second chemical element, and the noncrystalline semiconductor of the semiconductor gate layer includes the first chemical element and the second chemical element.

In one embodiment, the transistor includes a crystalline buffer layer between the channel and the dielectric layer.

According to an embodiment of the present invention there is provided an integrated circuit including a first field effect transistor and a second field effect transistor, each of the first field effect transistor and the second field effect transistor including: a channel including, as a major component, a first III-V semiconductor material; a dielectric layer on the channel; and a semiconductor gate layer including, as a major component, a noncrystalline semiconductor.

In one embodiment, a threshold voltage of the first field effect transistor is at least 30 mV greater than a threshold voltage of the second field effect transistor.

In one embodiment, the threshold voltage of the first field effect transistor is at least 60 mV greater than the threshold voltage of the second field effect transistor.

In one embodiment, the semiconductor gate layer of the first field effect transistor has the same thickness as the semiconductor gate layer of the second field effect transistor.

In one embodiment, the integrated circuit includes a third field effect transistor including: a channel including, as a major component, a first III-V semiconductor material; a dielectric layer on the channel; and a semiconductor gate layer including, as a major component, a noncrystalline semiconductor, wherein: the threshold voltage of the second field effect transistor is at least 30 mV greater than a threshold voltage of the third field effect transistor, and the semiconductor gate layer of the third field effect transistor has the same thickness as the semiconductor gate layer of the second field effect transistor.

BRIEF DESCRIPTION OF THE DRAWINGS

These and other features and advantages of the present invention will be appreciated and understood with reference to the specification, claims, and appended drawings wherein:

DETAILED DESCRIPTION

The detailed description set forth below in connection with the appended drawings is intended as a description of exemplary embodiments of a multiple threshold voltage (multi-Vt) gate stack for III-V nanosheet devices with reduced parasitic capacitance provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Figure 1:
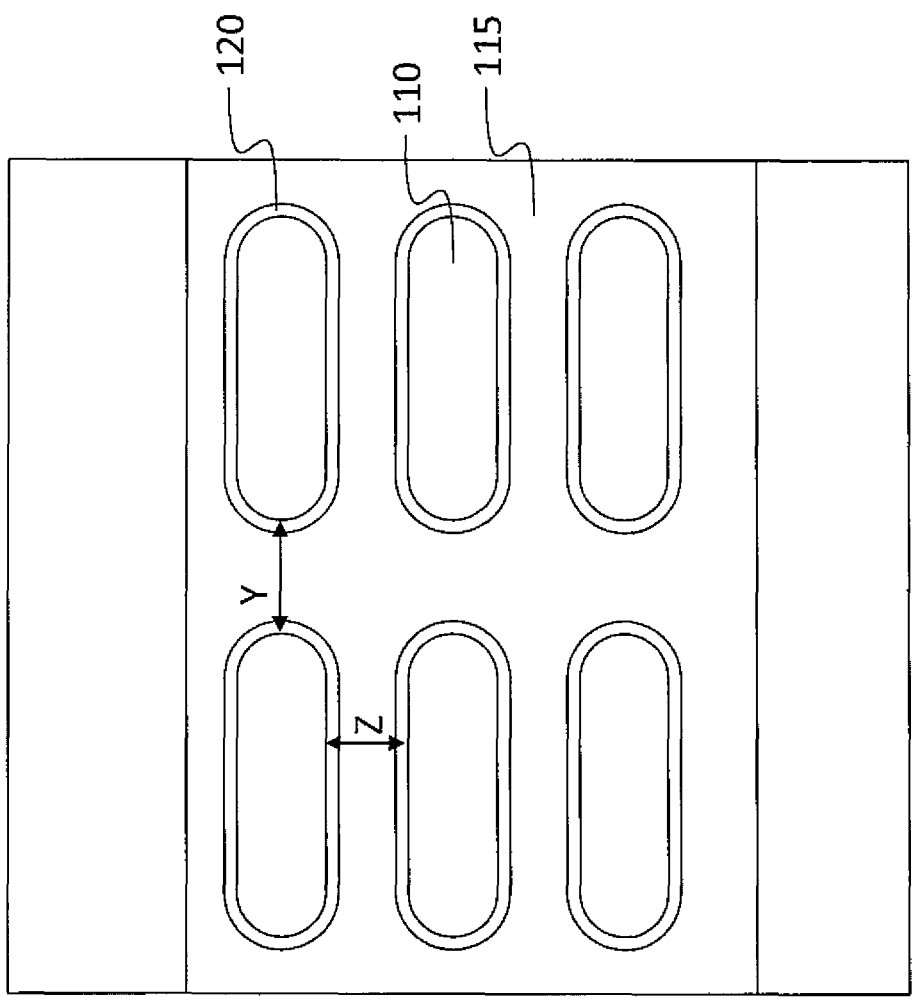
FIG. 1 is a cross-sectional view of a horizontal nanosheet field effect transistor, according to an embodiment of the present invention.

Referring to FIG. 1, in one embodiment a horizontal nanosheet field effect transistor includes a plurality of channels 110 surrounded by a wrap-around gate structure 115 insulated from each channel 110 by a dielectric layer 120 (e.g., a high dielectric constant dielectric layer). A workfunction metal may be used to form the gate structure 115, and the thicknesses of the workfunction metal layer gates may be adjusted to achieve a design threshold voltage. This design constraint on the gate layer thickness may result in relatively large channel-to-channel spacing. For example, the vertical channel-to-channel spacing Z in FIG. 1 may be equal to twice the thickness of the (high dielectric constant) dielectric layer plus the thickness of the workfunction metal layer between a pair of vertically adjacent channels, and it may be equal to between 15 and 18 nm.

Figure 2A:
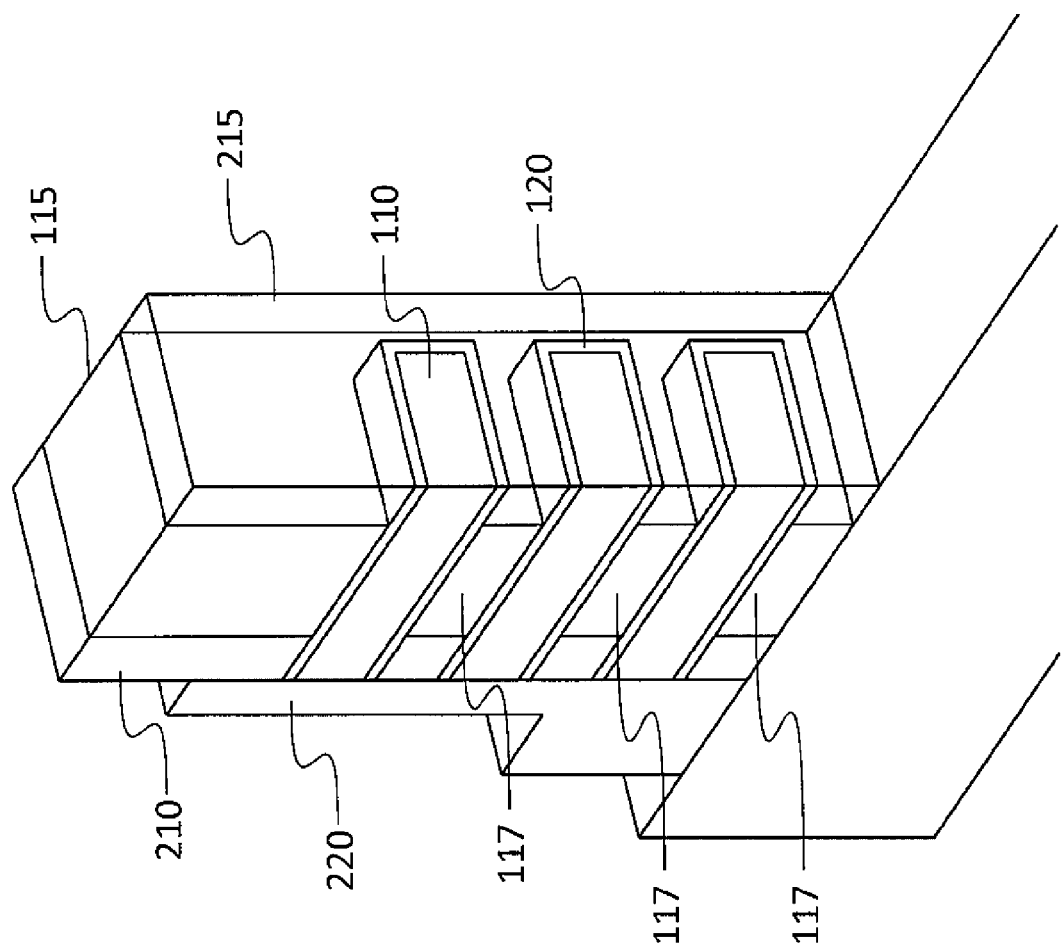
FIG. 2A is a first cutaway perspective view of a horizontal nanosheet field effect transistor, according to an embodiment of the present invention.
Figure 2B:
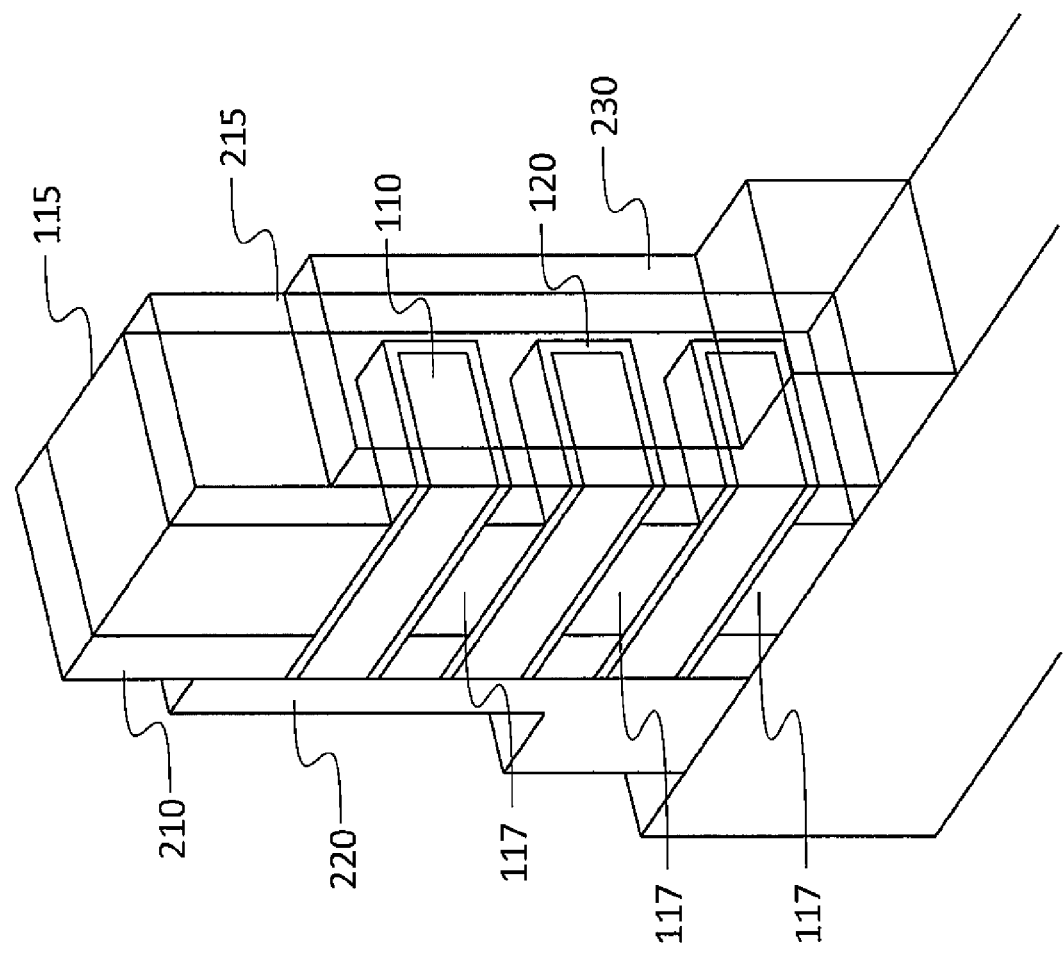
FIG. 2B is a second cutaway perspective view of a horizontal nanosheet field effect transistor, according to an embodiment of the present invention.

FIG. 2A is a cutaway perspective view of a horizontal nanosheet field effect transistor, with the cutaway taken along a cutting plane passing through the centers of three vertically stacked channels of a nanosheet field effect transistor. The gate structure 115 may include one or more gate layers 117 adjacent to a channel 110 or between two adjacent channels 110. In one embodiment, a first spacer 210 on one end of the nanosheet field effect transistor insulates the gate from a first epitaxially grown source drain contact 220 and a second spacer 215 on the other end of the nanosheet field effect transistor insulates the gate from a second epitaxially grown source drain contact 230 (see FIG. 2B; this contact is omitted from FIG. 2A for clarity). The spacers 210, 215 may be composed, for example, of silicon nitride. The proximity of the gate to the first source drain contact 220 and to the second source drain contact 230 results in parasitic capacitance between the gate and the first and second source drain contacts 220, 230. This parasitic capacitance may degrade the performance of the nanosheet field effect transistor, and it may increase as the gate thickness between channels (and the vertical channel-to-channel spacing) is increased. As such, a reduced gate thickness may result in improved performance. In FIG. 2A, the second spacer 215 is shown transparent for clarity, as are, in FIG. 2B, the second spacer 215 and the second source drain contact 230.

Figure 3:
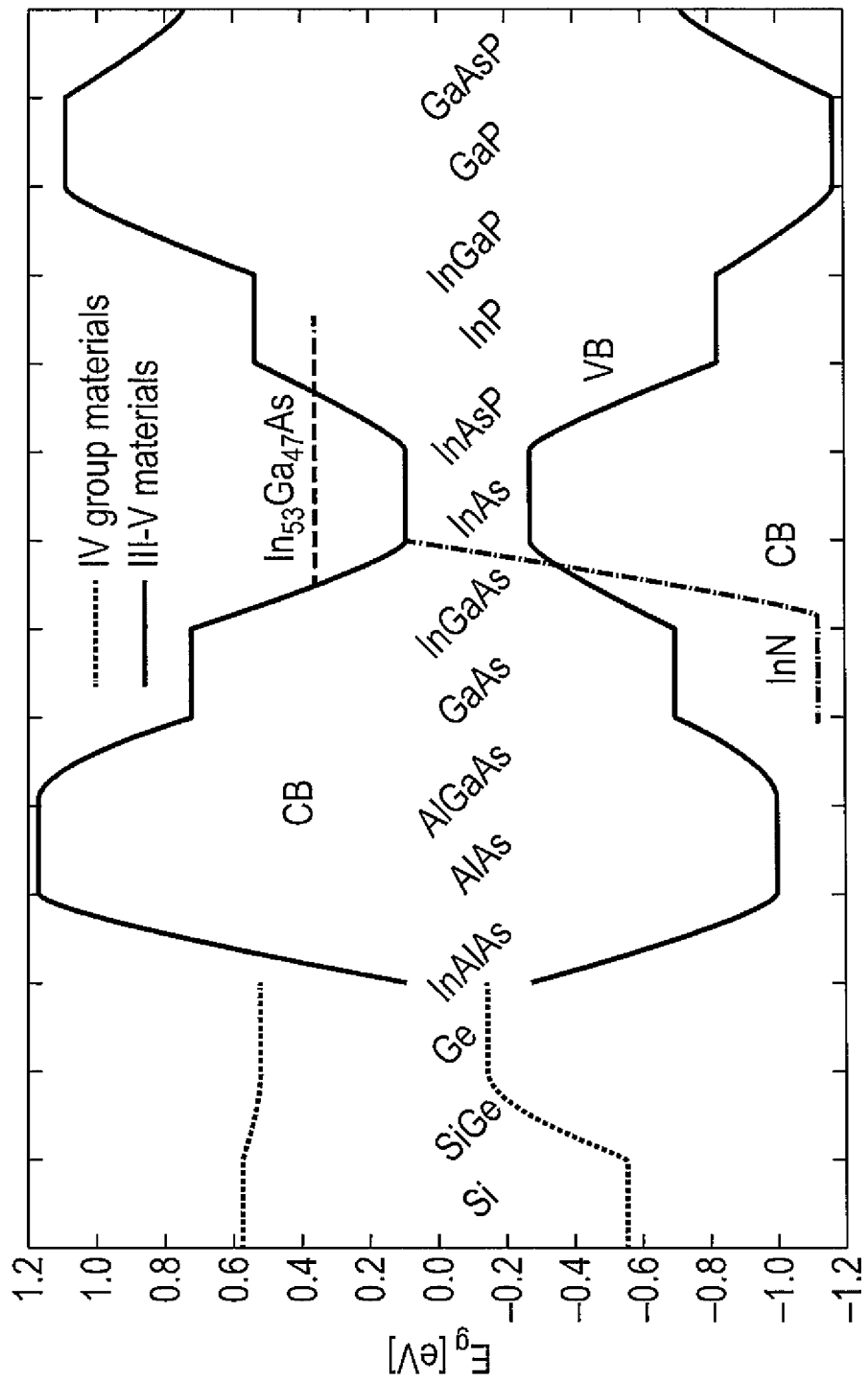
FIG. 3 is a band diagram of candidate gate and channel materials, according to an embodiment of the present invention.

In some embodiments a polycrystalline semiconductor may be used (in place of a workfunction metal) as the material for a gate conductor of a nanosheet field effect transistor. FIG. 3 shows, for example, the variation of valence and conduction band energies for various compositions of semiconductor materials that may be used in the channel 110 and in the gate 115. By adjusting the composition (e.g., stoichiometry) of the gate and/or the channel, the workfunction difference between the gate and the channel may be precisely tuned. For example, an appropriate mole fraction y of $In_yGa_{1-y}As$ in the polycrystalline semiconductor gate material may be selected, for a given mole fraction x of the $In_xGa_{1-x}As$ channel, to construct a nanosheet field effect transistor with a desired threshold voltage. The polycrystalline semiconductor gate material may be doped as heavily as the process used to form the polycrystalline semiconductor gate will permit, to reduce or minimize gate depletion. In some embodiments, the doping of the polycrystalline semiconductor gate material is greater than 1e19/cm$^3$ (i.e., the semiconductor gate layer includes a dopant at a concentration exceeding $1 \times 10^{19}/cm^3$), greater than 5e19/cm$^3$ (i.e., $5 \times 10^{19}/cm^3$), or even greater than 1e20/cm$^3$ (i.e., $1 \times 10^{20}/cm^3$).

For a channel 110 formed of a III-V material, low channel charge densities may result in significantly weaker gate depletion than would be the case with, e.g., a silicon germanium channel. The weaker gate depletion may mean that there is little performance loss if polycrystalline (poly) gates are used with III-V channels (unlike the case for Si/SiGe, which may have a higher density of states and suffer a significant penalty with a poly gate). In some embodiments the channel 110 is formed of a III-V material and the gate is also formed of a material from the same family (e.g., the material of the channel and the material of the gate have at least two chemical elements (e.g., gallium and arsenic) in common). In some embodiments the material of the channel and the material of the gate have the same chemical elements, in different proportions, or in the same proportions. In one embodiment the channel 110 is composed of $In_xGa_{1-x}As$ and the gate 115 is composed of $In_yGa_{1-y}As$.

Figure 4A:
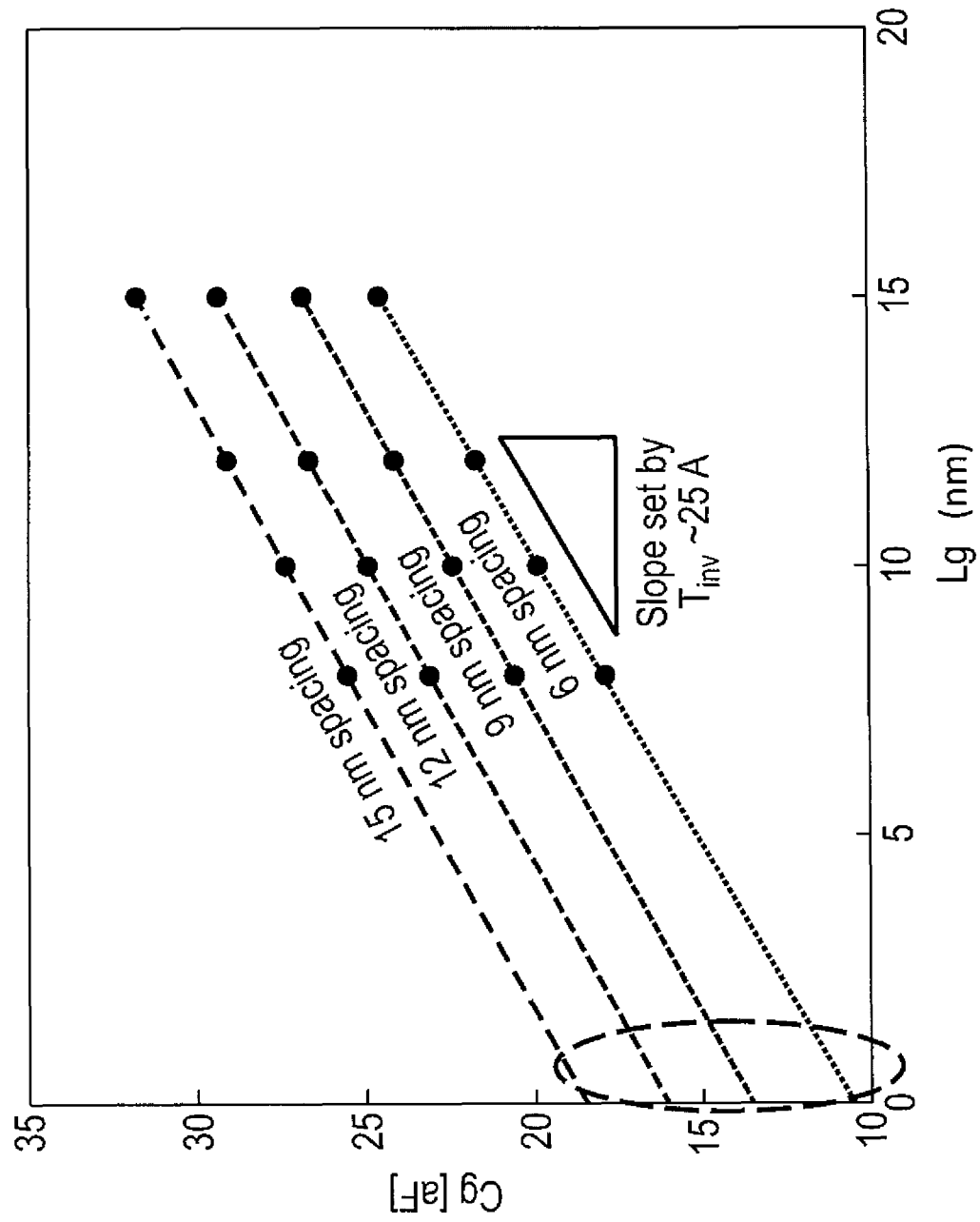
FIG. 4A is a graph of total gate capacitance as a function of gate length, according to an embodiment of the present invention.

Referring to FIG. 4A, in one embodiment the total gate capacitance Cg varies with the length Lg of the gate as shown, for various values of the channel-to-channel spacing. The parasitic capacitance in each case may be the vertical intercept of the respective line. A nanosheet field effect transistor constructed with a polycrystalline semiconductor gate material may have a relatively small channel-to-channel spacing. For example, the thickness of the gate may be as small as 3 nm if full depletion of the gate is to be prevented (allowing 1 nm of depletion from each side and reserving 1 nm of thickness as a neutral region); the corresponding channel-to-channel spacing may then be 5-6 nm if the total thickness of two high dielectric constant dielectric layers are taken into account. As a result a nanosheet field effect transistor with a polycrystalline semiconductor gate may have significantly lower parasitic capacitance than a nanosheet field effect transistor with a workfunction metal gate, the thickness of which may be greater, because the thickness may in some cases be selected to provide a specified threshold voltage.

Figure 4B:
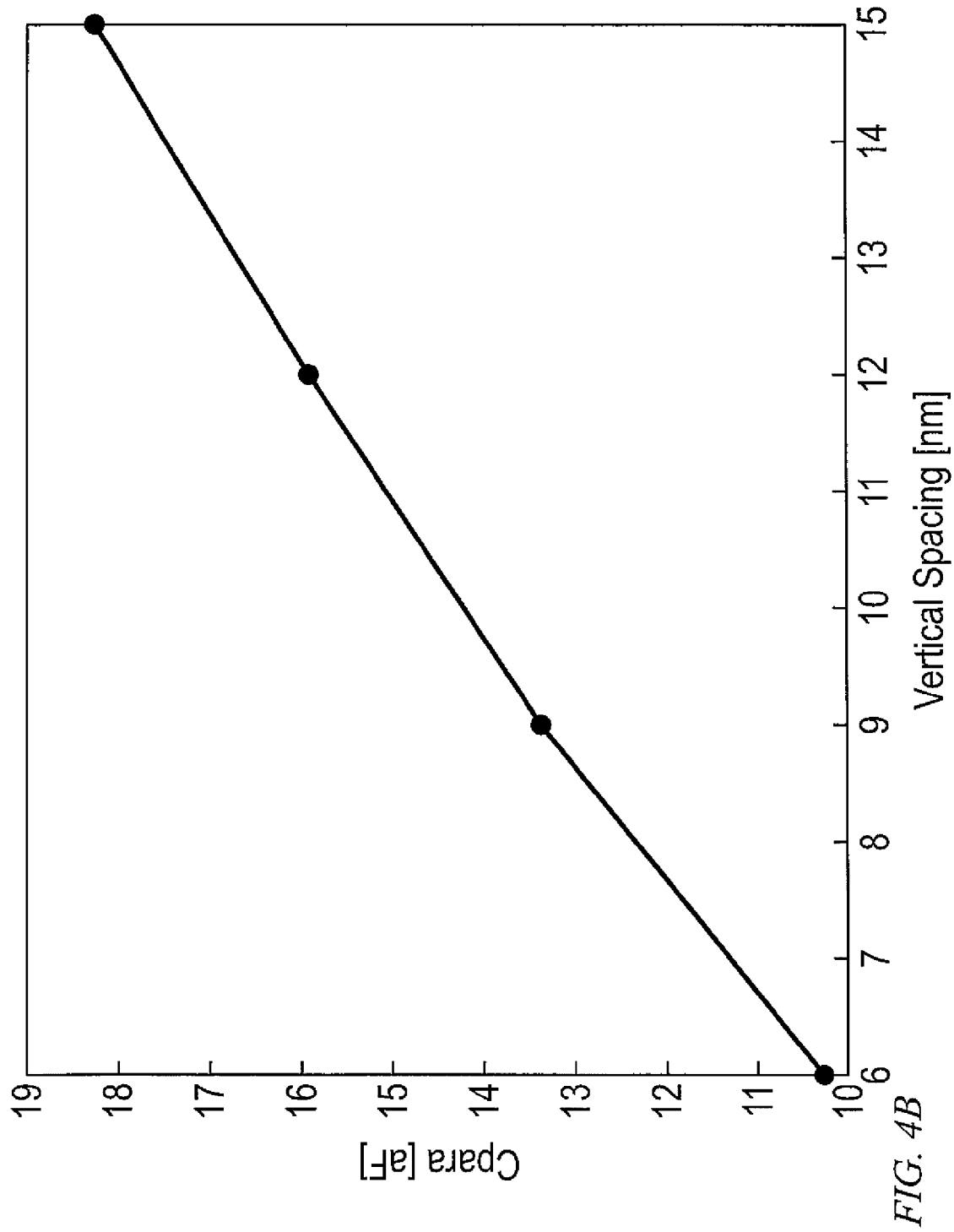
FIG. 4B is a graph of gate parasitic capacitance as a function of vertical channel-to-channel spacing, according to an embodiment of the present invention.

In some embodiments, the equivalent oxide thickness under inversion conditions ($T_{inv}$) may be relatively small (e.g., 25 Angstroms), and only slightly thicker (e.g., 1 Angstrom thicker) than it would be with a metal gate, in part because if the channel 110 is composed of a III-V semiconductor, it may have a relatively low density of states. Furthermore, the small decrease in drive current that results from the $T_{inv}$ increase may be compensated by an increase in the effective width (Weff), because the gate capacitance is likewise reduced. Because the parasitic fringe capacitance of the device may be significantly reduced (e.g., by a factor of two or more) compared to that of a metal gate device, the result can be an increase in total drive current at reduced front end of line (FEOL) capacitance. The variation of parasitic capacitance Cpara with vertical channel-to-channel spacing is further illustrated, for one embodiment, in FIG. 4B.

Figures 5A, 5B:
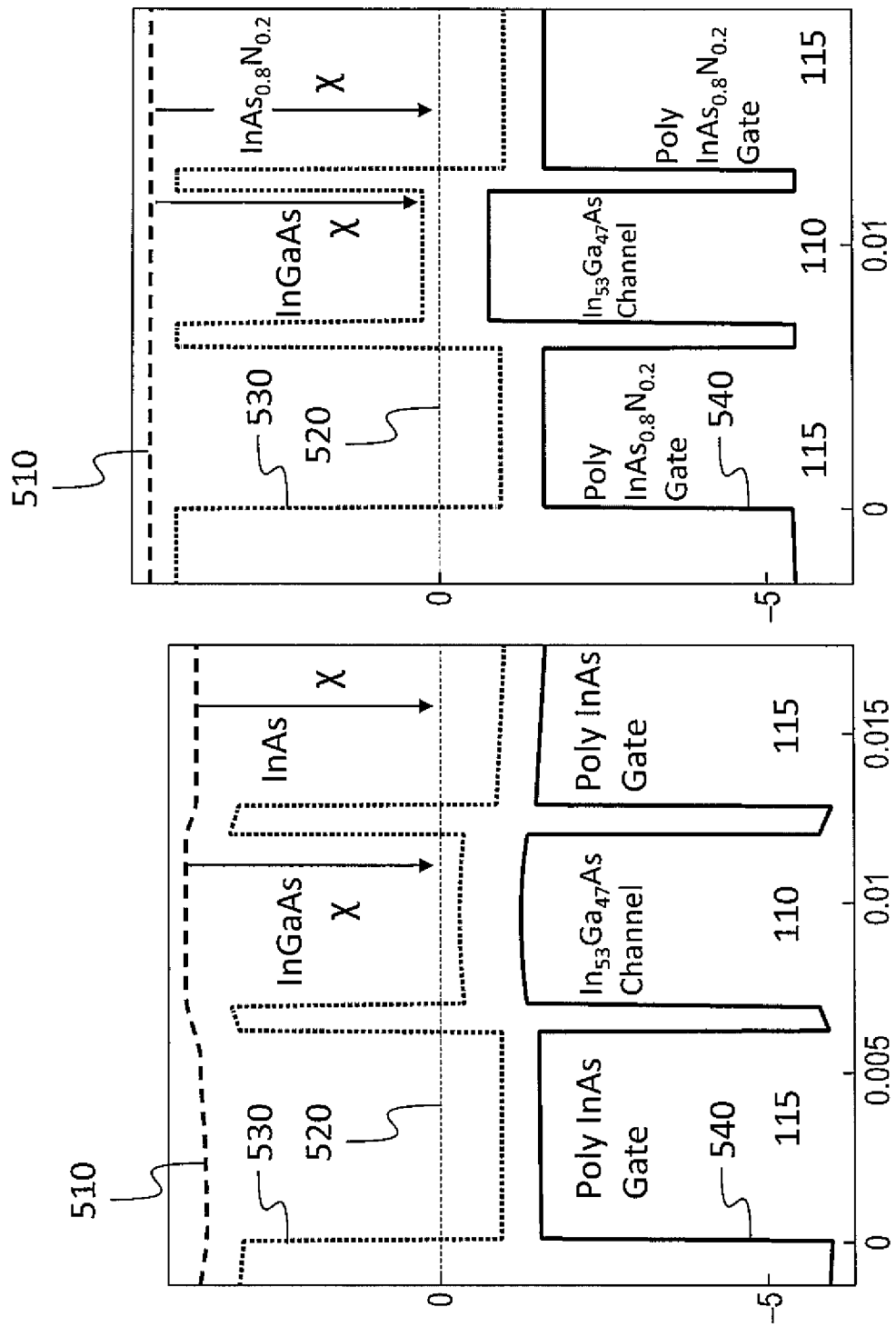
FIG. 5A is a band diagram of a nanosheet field effect transistor channel and two adjacent gates, according to an embodiment of the present invention.
FIG. 5B is a band diagram of a nanosheet field effect transistor channel and two adjacent gates, according to an embodiment of the present invention.

FIG. 5A shows a band diagram for a nanosheet field effect transistor according to one embodiment. The vacuum level 510 and Fermi level 520 are shown, as well as the conduction band 530 and the valence band 540. The affinity $\chi$ is shown for the indium gallium arsenide (e.g., $In_{53}Ga_{47}As$) channel 110 and for the polycrystalline indium arsenide gate 115 on one side of the channel 110. With III-V materials such as those of this structure, the Fermi level 520 may be relatively deep inside the conduction band (e.g., quite far above the conduction band 530), e.g., as a result of the gate 115 being heavily doped and as a result of the III-V material of the channel having a relatively low density of states. Although in such a nanosheet field effect transistor it may be possible to adjust the threshold voltage by suitable selection of the compositions of the channel 110 and the gate 115, the range of threshold voltages available may include only relatively low threshold voltages. The nanosheet field effect transistor of FIG. 5A may exhibit a current in the off state (the state of the band diagram) of about 1 microampere per micron.

Referring to FIG. 5B, in one embodiment, the inclusion of nitrogen in the polycrystalline semiconductor gate material may result in a lower Fermi level 520, and accordingly, an available range of threshold voltages including higher threshold voltages. The nanosheet field effect transistor of FIG. 5B may exhibit a current in the off state (the state of the band diagram) of about 0.1 nA per micron. The gate in the nanosheet field effect transistor illustrated in FIG. 5B is composed of polycrystalline indium arsenide nitride (e.g., $InAs_{0.8}N_{0.2}$) which may also have a relatively low density of states, but a larger electron affinity, resulting in a Fermi level 520 that may be below the conduction band in the channel 110, and in a higher threshold voltage than may be available with a gate composed only of polycrystalline indium arsenide. In some embodiments the polycrystalline semiconductor gate material is $In_xP_{1-x}N$, with x being greater than 0.0 and less than 1.0. In some embodiments the channel is composed of $In_xGa_{1-x}As$, with x being greater than 0.0 and less than 1.0, or, more specifically, greater than 0.2 and less than 0.6, or, more specifically, greater than 0.23 and less than 0.53. In some embodiments the gate is composed of with x being greater than 0.0 and less than 1.0, or, more specifically, greater than 0.0 and less than 0.4, or, more specifically, greater than 0.1 and less than 0.3.

In some embodiments the nanosheet field effect transistor is formed by a modified replacement metal gate process, the modification including (e.g., consisting of) substituting the deposition of a polycrystalline semiconductor gate material for the deposition of a work function metal.

Although horizontal nanosheet field effect transistors are illustrated herein, the present invention is not limited thereto, and, for example, analogous vertical nanosheet field effect transistors (e.g., with polycrystalline semiconductor gates) may be constructed according to embodiments of the present invention. Moreover, although gate materials mentioned herein include metals and polycrystalline semiconductor materials, in other embodiments a gate of a nanosheet field effect transistor may be composed of another non-crystalline material e.g., an amorphous semiconductor material. Thus, embodiments of the present invention provide nanosheet field effect transistors with thin gates and different threshold voltages. In some embodiments a single integrated circuit, or "chip" may include a plurality of nanosheet field effect transistors with the same channel composition and different gate compositions, and, accordingly, different threshold voltages. In some embodiments two or three subsets of the nanosheet field effect transistors on such a chip have two or three corresponding different threshold voltages, each (except the highest) of the threshold voltages differing from the next higher threshold voltage by an amount between 30 mV and 60 mV. In some embodiments the gate structure 115 of e.g., FIG. 2A may be a layered structure including, e.g., a layer of a polycrystalline semiconductor gate material directly on the dielectric layer 120, and a metal layer on the polycrystalline semiconductor gate material. In some embodiments, the channel 110 is a layered structure including a crystalline buffer layer (that may or may not be lattice-matched to the channel) between the channel and the dielectric layer 120. In some embodiments, the work function of the polycrystalline semiconductor gate material may readily be adjusted (by adjusting the composition of the polycrystalline semiconductor gate material) with a precision of 10 meV or even 1 meV.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art. As used herein, the term "major component" means a component constituting at least half, by weight, of a composition, and the term "major portion", when applied to a plurality of items, means at least half of the items.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present invention". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of a multi-Vt gate stack for III-V nanosheet devices with reduced parasitic capacitance have been specifically described and illustrated herein, many modifications and variations will be apparent to those skilled in the art. Accordingly, it is to be understood that a multi-Vt gate stack for III-V nanosheet devices with reduced parasitic capacitance constructed according to principles of this invention may be embodied other than as specifically described herein. The invention is also defined in the following claims, and equivalents thereof.

What is claimed is:

1. A field effect transistor, comprising:
   a channel comprising, as a major component, a first III-V semiconductor material;
   a dielectric layer directly on the channel; and
   a semiconductor gate layer, the dielectric layer being between the semiconductor gate layer and the channel, the semiconductor gate layer comprising, as a major component, a noncrystalline semiconductor,
   wherein the semiconductor gate layer comprises, as a major component, $In_xP_{1-x}N$, wherein x is between 0.1 and 0.9.

2. A field effect transistor, comprising:
   a channel comprising, as a major component, a first III-V semiconductor material;
   a dielectric layer on the channel; and
   a semiconductor gate layer comprising, as a major component, a noncrystalline semiconductor,
   wherein the semiconductor gate layer comprises, as a major component, $InAs_{1-x}N_x$, and
   wherein x is between 0.1 and 0.3.

3. The transistor of claim 2, wherein the semiconductor gate layer is less than 15 nm thick.

4. The transistor of claim 2, wherein the semiconductor gate layer comprises a dopant at a concentration exceeding $1\times10^{19}/cm^3$.

5. The transistor of claim 4, wherein the semiconductor gate layer comprises the dopant at a concentration exceeding $5\times10^{19}/cm^3$.

6. The transistor of claim 5, wherein the semiconductor gate layer comprises the dopant at a concentration exceeding $1\times10^{20}/cm^3$.

7. The transistor of claim 2, wherein the first III-V semiconductor material is $In_xGa_{1-x}As$, wherein x is between 0.0 and 1.0.

8. The transistor of claim 2, wherein the noncrystalline semiconductor is a polycrystalline semiconductor.

9. The transistor of claim 2, further comprising a metal gate layer on the semiconductor gate layer.

10. The transistor of claim 2, wherein the first III-V semiconductor material comprises a first chemical element and a second chemical element, and the noncrystalline semiconductor of the semiconductor gate layer comprises the first chemical element and the second chemical element.

11. A field effect transistor, comprising:
    a channel comprising, as a major component, a first III-V semiconductor material;
    a dielectric layer on the channel; and
    a semiconductor gate layer comprising, as a major component, a noncrystalline semiconductor,
    wherein the first III-V semiconductor material is $In_xGa_{1-x}As$, and
    wherein x is between 0.23 and 0.53.

12. The transistor of claim 11, wherein the semiconductor gate layer comprises, as a major component, $InAs_{1-x}N_x$, wherein x is between 0.0 and 1.0.

13. The transistor of claim 12, wherein x is between 0.0 and 0.4.

14. An integrated circuit comprising a first field effect transistor and a second field effect transistor, each of the first field effect transistor and the second field effect transistor comprising:
    a channel comprising, as a major component, a first III-V semiconductor material;
    a dielectric layer directly on the channel; and
    a semiconductor gate layer, the dielectric layer being between the semiconductor gate layer and the channel, the semiconductor gate layer comprising, as a major component, a noncrystalline semiconductor, wherein the semiconductor gate layer comprises, as a major component, $InAs_{1-x}N_x$, and wherein x is between 0.1 and 0.3.

15. The integrated circuit of claim 14, wherein a threshold voltage of the first field effect transistor is at least 30 mV greater than a threshold voltage of the second field effect transistor.

16. The integrated circuit of claim 15, wherein the threshold voltage of the first field effect transistor is at least 60 mV greater than the threshold voltage of the second field effect transistor.

17. The integrated circuit of claim 15, wherein the semiconductor gate layer of the first field effect transistor has the same thickness as the semiconductor gate layer of the second field effect transistor.

18. The integrated circuit of claim 17, further comprising a third field effect transistor comprising:

a channel comprising, as a major component, a first III-V semiconductor material;

a dielectric layer on the channel; and a semiconductor gate layer comprising, as a major component, a noncrystalline semiconductor, wherein:

the threshold voltage of the second field effect transistor is at least 30 mV greater than a threshold voltage of the third field effect transistor, and the semiconductor gate layer of the third field effect transistor has the same thickness as the semiconductor gate layer of the second field effect transistor.

19. The transistor of claim 1, wherein the semiconductor gate layer is less than 15 nm thick.

20. The transistor of claim 1, wherein the noncrystalline semiconductor is a polycrystalline semiconductor.

* * * * *